(12) United States Patent
Klein et al.

(10) Patent No.: US 7,245,497 B2
(45) Date of Patent: Jul. 17, 2007

(54) MODULAR ELECTRONICS ENCLOSURE

(75) Inventors: Robert D. Klein, Fort Wayne, IN (US); Robert E. Kartman, Fort Wayne, IN (US); Charles A. Geswein, Warsaw, IN (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 81 days.

(21) Appl. No.: 11/130,093

(22) Filed: May 17, 2005

(65) Prior Publication Data

US 2006/0262512 A1  Nov. 23, 2006

(51) Int. Cl.
H05K 5/00 (2006.01)

(52) U.S. Cl. .............. 361/752; 361/807; 361/800; 361/810

(58) Field of Classification Search ........ 361/752, 361/790, 800, 797, 807, 810, 735, 301
See application file for complete search history.

(56) References Cited

U.S. PATENT DOCUMENTS

| | | | |
|---|---|---|---|
| 4,399,487 A * | 8/1983 | Neumann | 361/727 |
| 5,008,487 A | 4/1991 | Shimmyo | |
| 5,034,856 A | 7/1991 | Cook et al. | |
| 5,097,978 A * | 3/1992 | Eckerd | 220/315 |
| 5,223,996 A * | 6/1993 | Read et al. | 360/97.02 |
| 5,375,040 A | 12/1994 | Cooper et al. | |
| 5,381,304 A | 1/1995 | Theroux et al. | |
| 5,414,593 A * | 5/1995 | Furlan | 361/784 |
| 5,502,620 A * | 3/1996 | Funck et al. | 361/753 |
| 5,576,937 A | 11/1996 | Kubo | |
| 5,682,299 A | 10/1997 | Kunert | |
| 5,731,541 A * | 3/1998 | Bernd et al. | 174/387 |
| 5,841,189 A | 11/1998 | Shitama | |
| 5,848,718 A | 12/1998 | Colwell | |
| 6,049,462 A | 4/2000 | Lin | |
| 6,058,024 A | 5/2000 | Lyford | |
| 6,144,557 A | 11/2000 | Chen et al. | |
| 6,181,564 B1 | 1/2001 | Furusho | |
| 6,194,655 B1 | 2/2001 | Lange, Sr. et al. | |
| 6,359,218 B1 | 3/2002 | Koch et al. | |
| 6,498,728 B1 | 12/2002 | Sarno et al. | |
| 6,536,621 B2 | 3/2003 | Yokobori | |
| 6,570,089 B1 | 5/2003 | Mc Grew et al. | |
| 2001/0004316 A1 | 6/2001 | Denzene et al. | |
| 2003/0043547 A1 | 3/2003 | Nealis | |
| 2003/0066832 A1 | 4/2003 | Kipja et al. | |
| 2003/0136780 A1 | 7/2003 | Sato et al. | |
| 2003/0186570 A1* | 10/2003 | Ito | 439/79 |

FOREIGN PATENT DOCUMENTS

| | | |
|---|---|---|
| EP | 0671704 A1 | 3/1995 |
| EP | 1026628 A2 | 1/2000 |
| WO | WO 97/40652 A1 | 10/1997 |

* cited by examiner

Primary Examiner—Tuan T. Dinh
Assistant Examiner—Hung S. Bui
(74) Attorney, Agent, or Firm—Edell, Shapiro & Finnan, LLC

(57) ABSTRACT

A modular electronics enclosure for one or more circuit card assembly includes top and bottom lids formed substantially the same with at least one intermediate circuit card support member disposed therebetween. At least one spring clip clamps the top and bottom lids together around the intermediate support member.

25 Claims, 7 Drawing Sheets

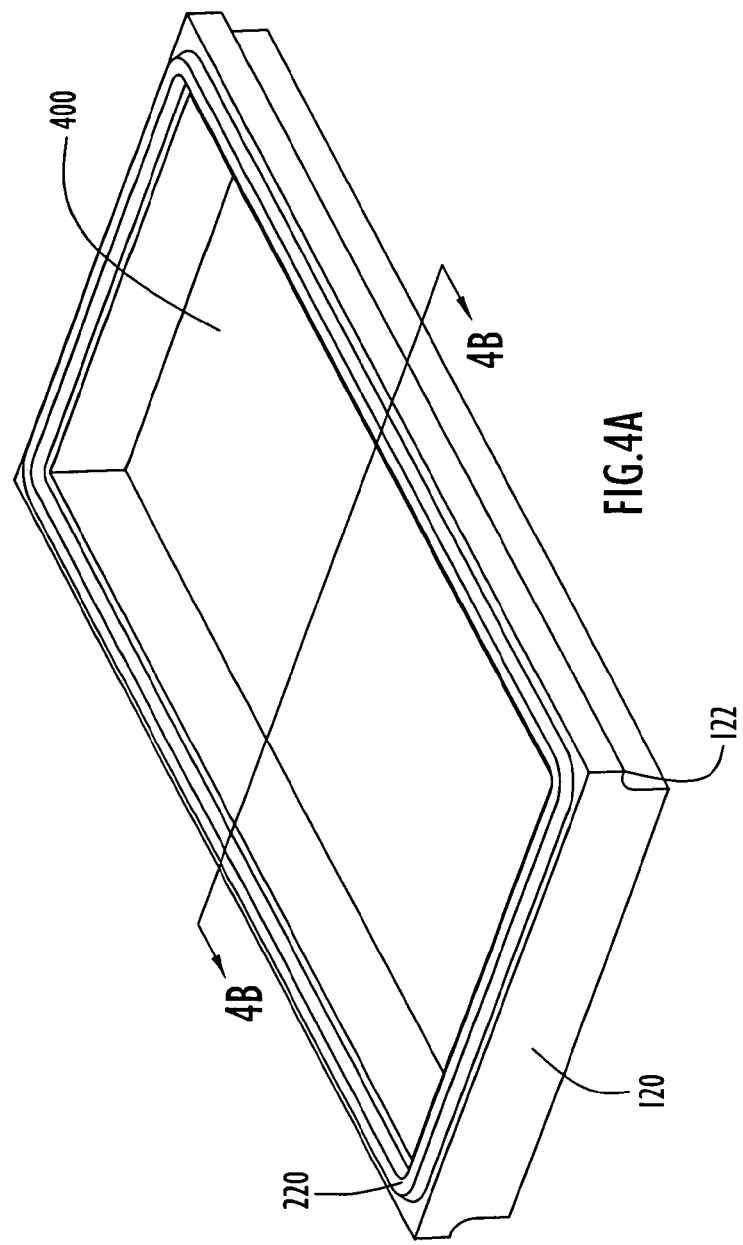
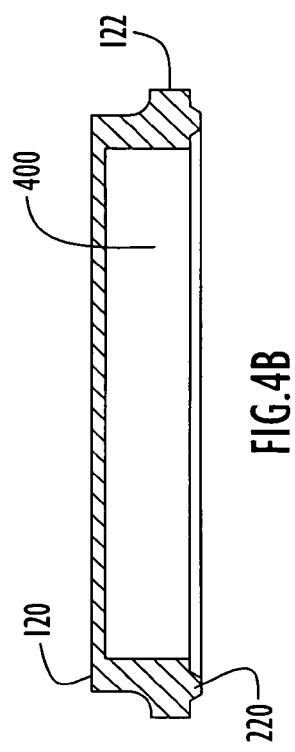
FIG.4A
FIG.4B

MODULAR ELECTRONICS ENCLOSURE

BACKGROUND OF THE INVENTION

1. Field of the Invention

The present invention pertains to an enclosure for electronics. In particular, the present invention pertains to a modular enclosure for housing electronic components. The modular container comprises interchangeable elements to expand or reduce the interior volume of the container.

2. Description of the Related Art

As seen in FIG. 1, conventional electronics enclosures 10 are typically constructed to include four sides 12, a top 14 and a bottom 16. In some instances, the bottom 16 is formed integrally with the sides 12. The top 14 and bottom 16, or top 14 only in the case of the latter, are then secured to the sides 12 in order to seal the enclosure and any circuit card assemblies therein.

Typical enclosures are sealed through a variety of methods. In one version, the top and bottom 12 and 14 are held in place around an intermediate section that forms or is integral with the sides 12 via a nut 20 and bolt 22 assembly. The bolt 22 passes through apertures or holes 24 in the corners of the top 12 and bottom 16, leaving the threaded end 26 accessible to thread a nut 20 thereon. The intermediate section may have matching passages 28 through which the bolt 22 passes in the walls and at positions corresponding to holes 24 in the top 14 and bottom 16. Alternatively, the top and bottom 14 and 16 have a skirt that extends beyond the outer perimeter of the intermediate section and the bolt passes through the top and bottom only; the intermediate section being securely held between the top and bottom.

Threaded fasteners have several disadvantages when assembling modules for housing circuit card assemblies. For instance, threaded fasteners increase the time required for assembly and disassembly of a modular enclosure; torque must be applied to each fastener for assembly, which requires additional verification to ensure the proper amount of torque has been applied. Thus, enclosure envelope size is often made larger than necessary for certain uses, in order to accommodate a sufficient number of appropriately sized fasteners to provide adequate clamping pressure. The increased clamping pressure is required to create a seal preventing the contamination of the enclosure from environmental conditions.

In addition to inspecting proper assembly torque application, each fastener must be inspected to make sure it is not missing, that they have been properly installed, and that any additional elements, e.g., lock washer, are also included.

The enclosures are designed to house one or more circuit card assemblies within. Normally, internal circuit card assemblies are fastened to the bottom 16 from the inside and/or are stacked one on top of each other. The circuit card assemblies are positioned and secured inside the enclosure with a required standoff distance from each other. The required distance is achieved by securing mounting bosses or similar hardware onto the mounting panel of the enclosure. When an enclosure contains fewer circuit card assemblies than it is designed to hold, a portion of the enclosure is wasted, and therefore decreases the packing efficiency of the enclosure. One shortfall is that space must be reserved to accommodate fasteners, (e.g., screw heads, washers) on both the upper and lower surfaces of the circuit card assemblies. Should a circuit card assembly be re-laid (i.e., turned), the pre-existing mounting boss locations may become an impediment to circuit routing and component placement. This design requirement is a significant limitation of the existing enclosure designs.

Yet another drawback of the prior art enclosures is the inability to provide adequate electromagnetic interference (EMI) shielding. EMI shielding is pre-planned to maximize efficiency and effectiveness of the enclosure. The efficiency and effectiveness of the pre-planned EMI shielding is reduced when less than the intended number of circuit card assemblies is housed within an enclosure.

Similarly, thermal transfer of heat and electrical grounding are achieved through contact with bosses and/or mounting screws and conveyed through the chassis. Those designs create hot spots and require heat sinks in the vicinity of the bosses to avoid damaging the circuit card assemblies.

In this respect, each enclosure is unique, allowing for very limited expansion of the enclosure to accommodate additional or different circuit card assemblies. Most modular enclosures of the prior art are specifically constructed to house a specific number of circuit card assemblies. This configuration restricts the flexibility of the enclosure to accommodate a varying number of circuit card assemblies.

Furthermore, a necessary characteristic of enclosures for circuit card assemblies is the ability to provide thermal conduction away from the circuit card assemblies. The prior art enclosures utilize mounting bosses to provide the necessary thermal conduction of heat generated on the circuit card assemblies, but the mounting bosses actually in turn transfer that heat to the enclosure structure itself.

SUMMARY OF THE INVENTION

Briefly, a modular electronics enclosure is provided having first and second opposing lids. At least one intermediate circuit card support member is secured and sandwiched between the first and second lids. The intermediate support member has a rim or ledge with surfaces to support an edge of a circuit card assembly to be contained in the enclosure. At least one clip member engages and clamps the first and second lids together around the intermediate support member. The first and second lids and the intermediate support member have complementary tongue and groove structures that engage each other when the enclosure is assembled. Moreover, the enclosure may contain multiple intermediate support members stacked or nested on top of each other, and sandwiched by the first and second lids. In a stacked configuration, the adjacent intermediate support members have complementary tongue and groove structures. Each intermediate support member may have multiple (e.g., two) ledges spaced apart to thereby support two circuit card assemblies spaced apart from each other by the thickness and position of the ledges on the intermediate support member.

Inside the enclosure there is a gasket member positioned to be compressed in the groove by a complementary tongue structure of an adjacent lid, or another intermediate support member as the case may be. In addition, an interface gasket may be positioned between the ledge surface of an intermediate member and an edge surface of a circuit card assembly to secure the circuit card assembly in position, as well as to provide an electrically conductive and thermally conductive path for electrical grounding and heat distribution.

The first and second lids each have a slot bounded by a lip. The clip engages the slot on the first and second lids and clamps the lids together and in so doing, applies compressing force to the gasket position between the tongue and groove structures, and to the interface gasket positioned between the ledge support surfaces and the edge of the circuit card assemblies. Two clips may be used to clamp the lids together at opposite ends of the lids. The clips may be formed of a spring-biased material, or may be made of shaped memory alloy material.

The electronics enclosure described herein is a flexible and cost effective design that is easy to use and assemble. Other objects and advantages will become more apparent when reference is made to the following description taken in conjunction with the accompanying drawings.

BRIEF DESCRIPTION OF THE DRAWINGS

FIG. 4A is a perspective view of the top lid (turned upside) of the modulator electronics enclosure.

FIG. 4B is cross-sectional view (turned over) taken along line 4B-4B of the top lid shown in FIG. 4A.

DETAILED DESCRIPTION

A modular electronics enclosure is provided having at least one intermediate section that engages substantially similar top and bottom lid members via complementary structures, such as tongue and groove structures. A spring biased clip clamps the top and bottom lid members to hold the entire enclosure together. The one or more intermediate sections are constructed to be interchangeable to increase or decrease the capacity of the modular enclosure, as well as allowing for profile specific designs.

Figure 1:
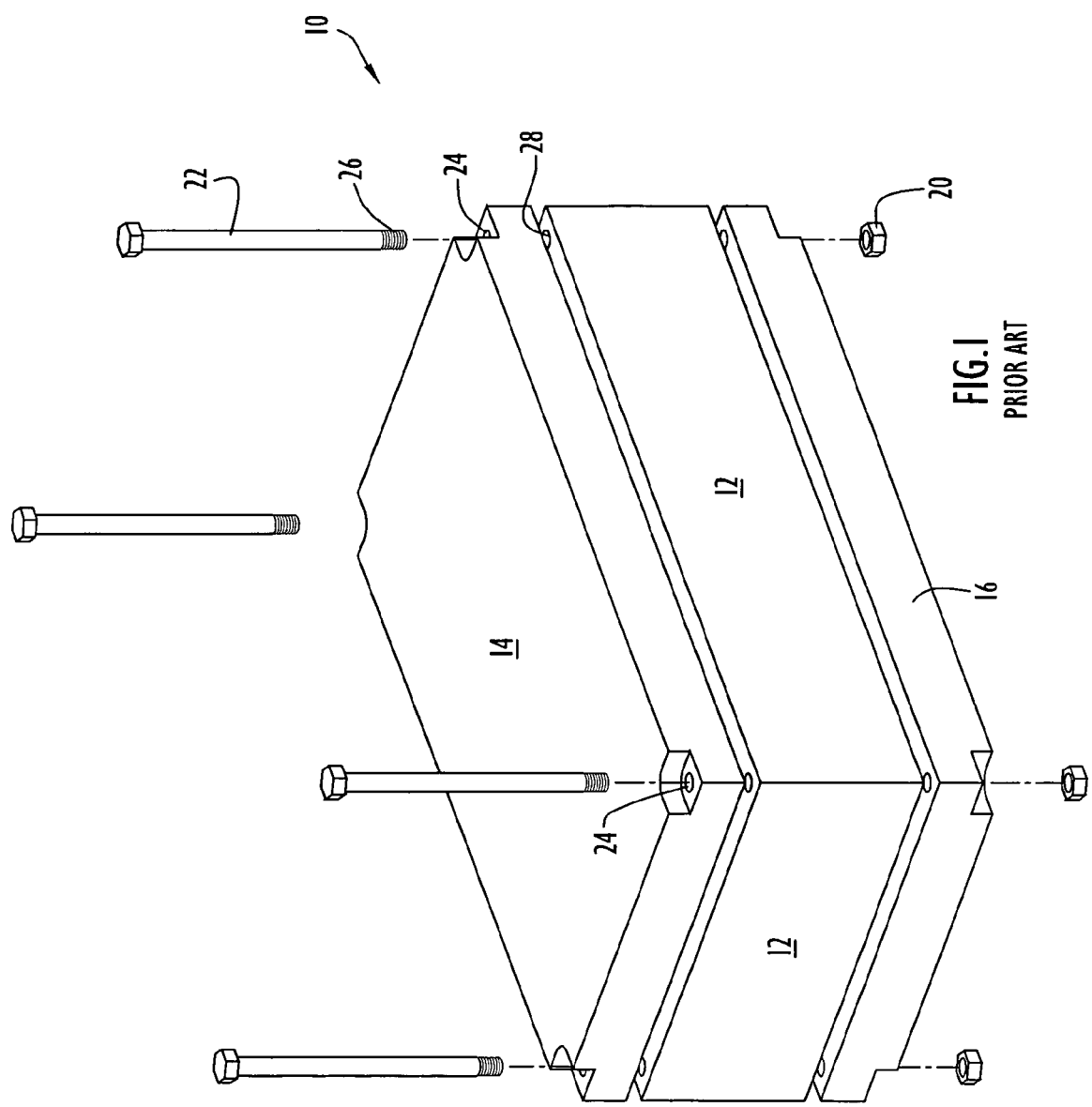
FIG. 1 is a perspective view of a prior art enclosure.
Figure 2:
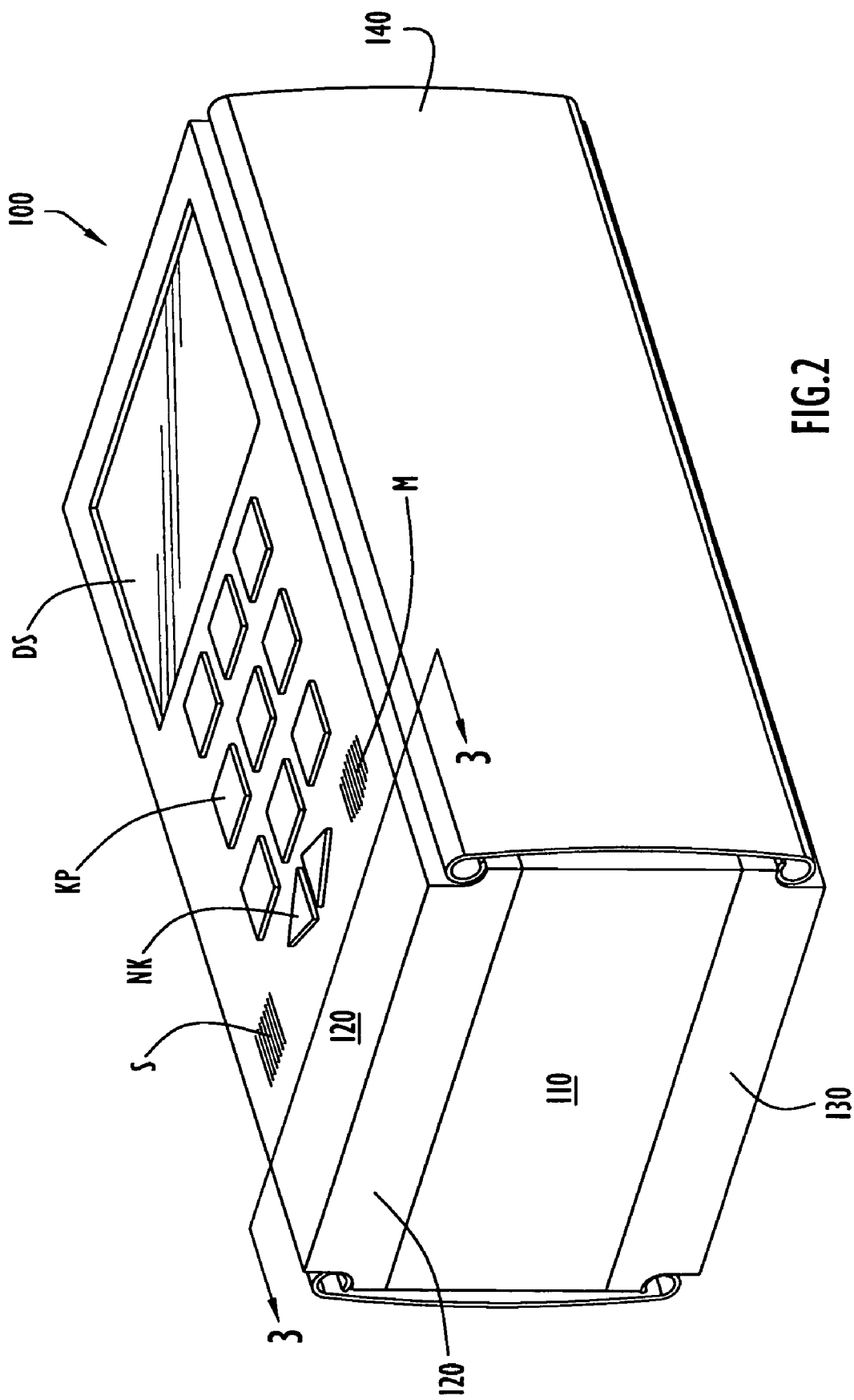
FIG. 2 is a perspective view of one embodiment of a modulator electronics enclosure.

FIG. 2 is a perspective view of an embodiment of modular enclosure 100. Modular enclosure 100 comprises an intermediate support section or member 110 that supports at least one circuit card assembly (CCA), a top lid member 120 and bottom lid member 130. A clip 140 engages the top 120 and bottom 130 to secure the intermediate section 110 in a sandwich arrangement. Two clips 140 are shown that engage opposite sides of the top lid 120 and bottom lid 130. The clips 140 are an example of a means for securing the top and bottom lid members around the intermediate support member 110. Similarly, the intermediate support member 110 is an example of a supporting means for supporting a circuit card assembly between the top and bottom lid members. It should be noted at this point, that the dimensional relationships of intermediate section 110, top 120 or bottom 130 are not restricted to the sizes or shapes shown in FIG. 1, but can take the form of any dimension or shape necessary to encase one or more circuit card assemblies. Additionally, FIG. 2 illustrates modular enclosure 100 as having four sides, but it is within the scope of the present invention to have a modular enclosure that has three or more sides and encased by a corresponding top and bottom held together by an appropriate number of clips 140.

A man machine interface (MMI) may be provided on a surface of the top or bottom lid member 120,130 to engage or make electrical connection to one or more components on a circuit card assembly contained inside the enclosure. Examples of such MMI are shown in FIG. 2 and include a display screen (DS), keypad (KP), navigation keys (NK), speaker (S) and microphone (MI).

Figure 3:
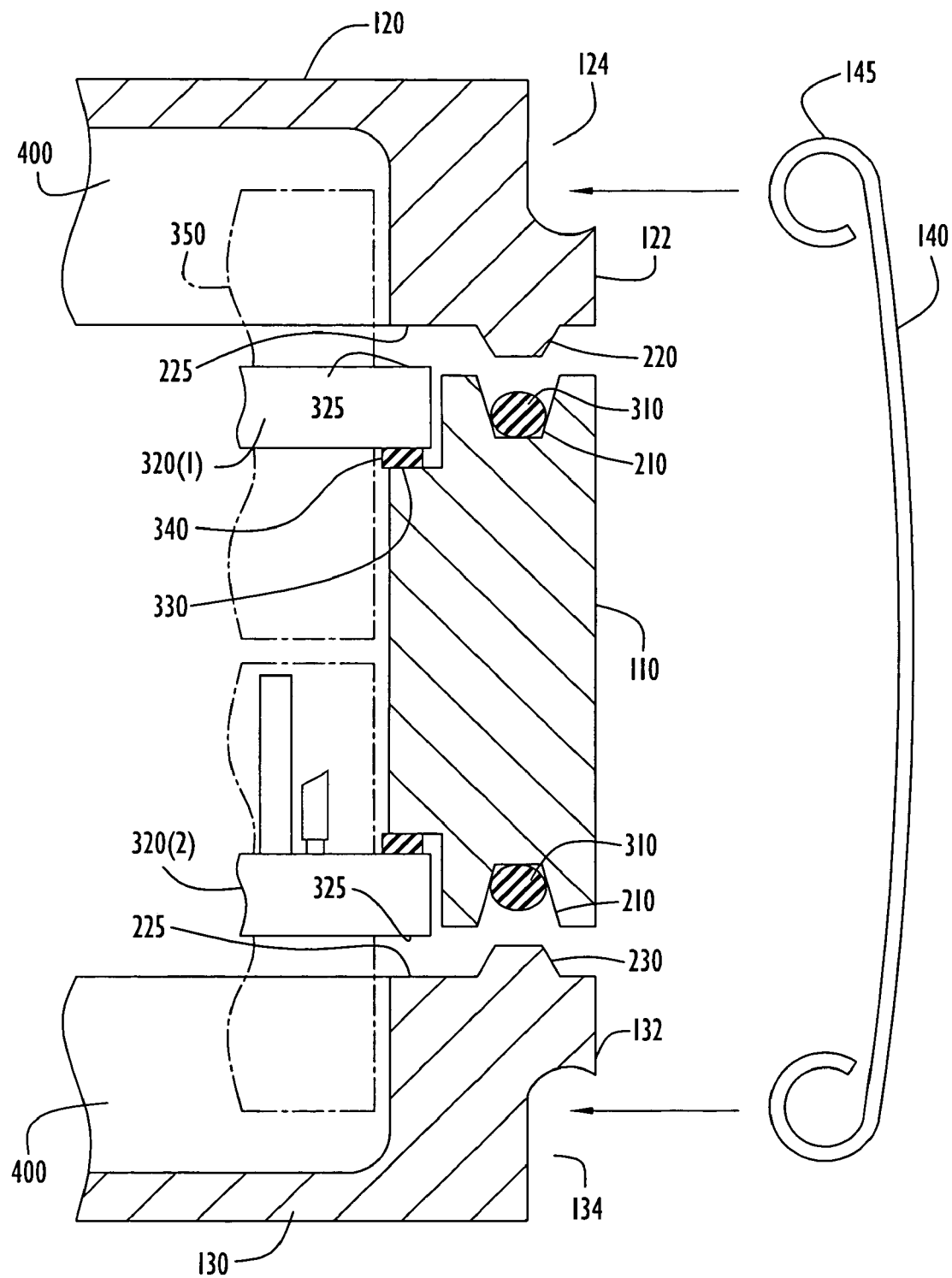
FIG. 3 is a cross-sectional view taken along lines 3-3 of the enclosure shown in FIG. 2.

Top and bottom lid members 120, 130 may be formed to have substantially the same shape and design. This minimizes manufacturing costs and errors generated during assembly of the modular enclosure. As best seen in FIG. 3, top and bottom lid members 120, 130 have a lip 122,132, respectively, along their periphery. Clips 140 are provided that snap or slide over the lips 122,132 into the slots 124,134 adjacent the lips on the top and bottom lid members 120,130, respectively. The clips 140 may be formed of a material that is spring-biased to provide an equal distribution of clamping pressure along the periphery of the top and bottom 120,130. The clip 140 has a pair of curved or looped ends 145 that fit into grooves or cavities adjacent the lips 122,132 of the top and bottom lid members 120, 130, respectively, as shown by the arrows in FIG. 3, to provide a distributed clamping pressure along the entire peripheral surface of top and bottom lids 120, 130.

Alternatively, the clips 140 may be formed of a shaped memory alloy (SMA). In this case the clips are 140 pre-stretched to easily slide into the slots 124,134. Once in position, the SMA-clips are subjected to heat (or allowed to cool) to shrink towards their original shape. This allows the SMA-clips to apply a clamping load on the lids of the enclosure. Regardless of which form of the clips are used, the clips 140 provide sufficient clamping pressure along the perimeter of top and bottom lids 120,130 to overcome the compressive properties of both the environmental gaskets and the interface gaskets holding the CCAs in place. Clips 140 maintain an evenly distributed clamping pressure on the enclosure, allowing for a clamping force along a substantial length of the environmental gasket, whereas the conventional threaded fastener applies a direct clamp force only in the enclosure corners. Depending on the dimensions of the enclosure (and the ratio of length to width) the percentage of perimeter length subjected to direct clamping will vary. For example, the range of percentages may be from 10% to nearly 100%. Thus, the rigidity of the covers are more critical in the prior art to ensure adequate environmental gaskets (FIG. 3) are maintained. By providing evenly distributed clamping pressure in accordance with the present invention, top and bottom lids can be constructed without the required rigidity. Furthermore, the evenly distributed pressure also ensures the preferred compression is maintained on the circuit card assemblies disposed there. The clips 140 further maintain metal to metal contact between enclosure sections, and provide additional grounding and thermal sinking if necessary.

Complementary structures are provided on at least one of the top and bottom lid members 120,130 and the intermediate support member 110 to mount and align the intermediate support member 110 between the top and bottom lid members 120,130. For example, the top and bottom lid members 120, 130 have a tongue structures 220, 230, respectively, projecting perpendicular to their inward facing surfaces along their periphery. The intermediate member 110 has a pair of complementary grooves (groove structures) 210 along its periphery to engage with the tongues 220, 230. Alternatively, the top and bottom lid members 120,130 may have groove structures and the intermediate member 110 may have complementary tongue structures that mate and fit into the groove structures on the lid members 120,130.

The geometric profile of the tongue and groove structures shown in FIG. 3 is an example of a design that facilitates assembly. However, other profiles and shapes for complementary structures may be suitable, e.g., triangular, square, arcuate.

The top and bottom lid members 120,130 and the intermediate member 110 may be finished on their exterior surfaces with paint. However, the surfaces where contact is made between the intermediate member 110 and each of the lid members 120,130 is to be free of paint to permit electrically conductive contact between these sections at final assembly.

An environmental gasket 310 may be disposed in the groove 210 between the intermediate support member 110 and the top and/or bottom lid members 120,130. The gasket 310 is an environmental barrier or seal to provide a barrier between internal contents of the modular enclosure 100 and incidental contact with the external environmental elements. The clip 140 is constructed to provide sufficient clamping pressure to between the top and bottom lid members 120,130 and the intermediate member 110 to ensure that the environmental gaskets 310 deform properly and thereby create a sufficient barrier as desired. Nevertheless, the gaskets 310 are sized to permit direct contact of metal surfaces of adjacent members (intermediate member to lid member or intermediate member to another intermediate member) in the vicinity of the tongue and groove structures.

With continued reference to FIG. 3, the following describes the mounting of circuit card assemblies (CCAs) 320(1) and 320(2) within the modular enclosure 100. The intermediate support member 110 has at least one inner surface (two are shown in FIG. 3 each) having a recessed rim or ledge 330. The ledge 330 may also be considered and referred to as a shoulder. Each ledge 330 supports an edge or periphery of a CCA 320(1) or 320(2). An opposite facing surface 225 on the top and bottom lid members 120,130 engages a surface 325 of the CCA 320(1) or 320(2) when the enclosure is secured by the clips 140 to prevent any vertical movement of the CCAs. If multiple CCAs are contained in the enclosure, they all may have (though it is not required) the same length and width dimensions.

An interface gasket 340 is provided at the interface of the intermediate support member 110 and the CCA 320. The interface gasket 340 may be made of material(s) that exhibit thermal and electrical conductivity, and also elastic properties. While FIG. 3 shows a single interface gasket 340 interacting with one surface of the 320, it may be desirable to provide an interface gasket on the opposite surface of the CCA 320 between the CCA surface 325 and the surface 225 of the top and bottom lid member 120,130, either alone or in combination with interface gasket in the position shown in FIG. 3. The interface gasket(s) 340 is placed where the greatest thermal transfer benefit may be realized. The flexibility of changing implementation positions of the interface gasket 340 allows customization of the enclosure assembly with minimum work to make changes. Additionally, the interface gasket 340 can vary in size to provide additional stand off distance as required by certain CCAs 320. A minimum depth of the rim or ledge 330 is defined by the thickness of the CCA 320 plus a marginal distance to include the interface gasket 340. Interface gasket 340 can be placed first on the CCA 320 and then inserted onto the rim 330, or is placed on the rim 330 prior to insertion of the CCA 320. The edge surfaces of the CCA 320 are finished in order to make electrical and thermal contact with the intermediate member 110 and lid members 120,130, thereby ensuring good electrical grounding and a thermal path to the enclosure. The intermediate member 110 may serve as a reception of transmission antenna for one or more circuits contained on a CCA.

The interface gasket 340 is made of material that exhibits elastic properties sufficient to lock the CCA 320 from movement once the clips 140 are attached. This eliminates the possibility of damage to the CCA 320 without the use of threaded fasteners. For example, an interface gasket 340 is made of (electrically and thermally conductive) material(s) with a relatively high durometer reading to ensure sufficient clamping pressure is applied to the CCAs. In addition, the elasticity of the interface gasket 340 provides structural support against shock and vibration when the enclosure is assembled. Furthermore, the thermal and electrical conductivity properties of the interface gasket 340 serve to provide thermal transfer and electrical grounding for the CCAs.

An important feature of the modular enclosure design is the component "envelopes" provided for components on each CCA 320. Each CCA 320 has a required component envelope 350 indicated by the dashed lines around each CCA 320. The component envelope 350 is dictated by the heights of the elements or components fused or otherwise attached to the CCA 320. Thus, the cross-sectional thickness of the intermediate member 110 is also a function of the necessary component envelopes 350.

Turning to FIGS. 4A and 4B, with continued reference to FIG. 3, in order to accommodate the component envelopes 350, the top and bottom lid members 120, 130 have a recess or cavity 400 formed therein. The lips 122,132 on the top and bottom lid members 120,130, respectively, extend along the edge or periphery of at least two parallel surfaces of the top and bottom lid members 120,130. Similarly, tongue structures 220,230 extend along the entire perimeter of inner surfaces of the top and bottom lid members 120,130, respectively, to ensure a proper environmental barrier is provided to the internal contents of the enclosure 100.

Figure 5:
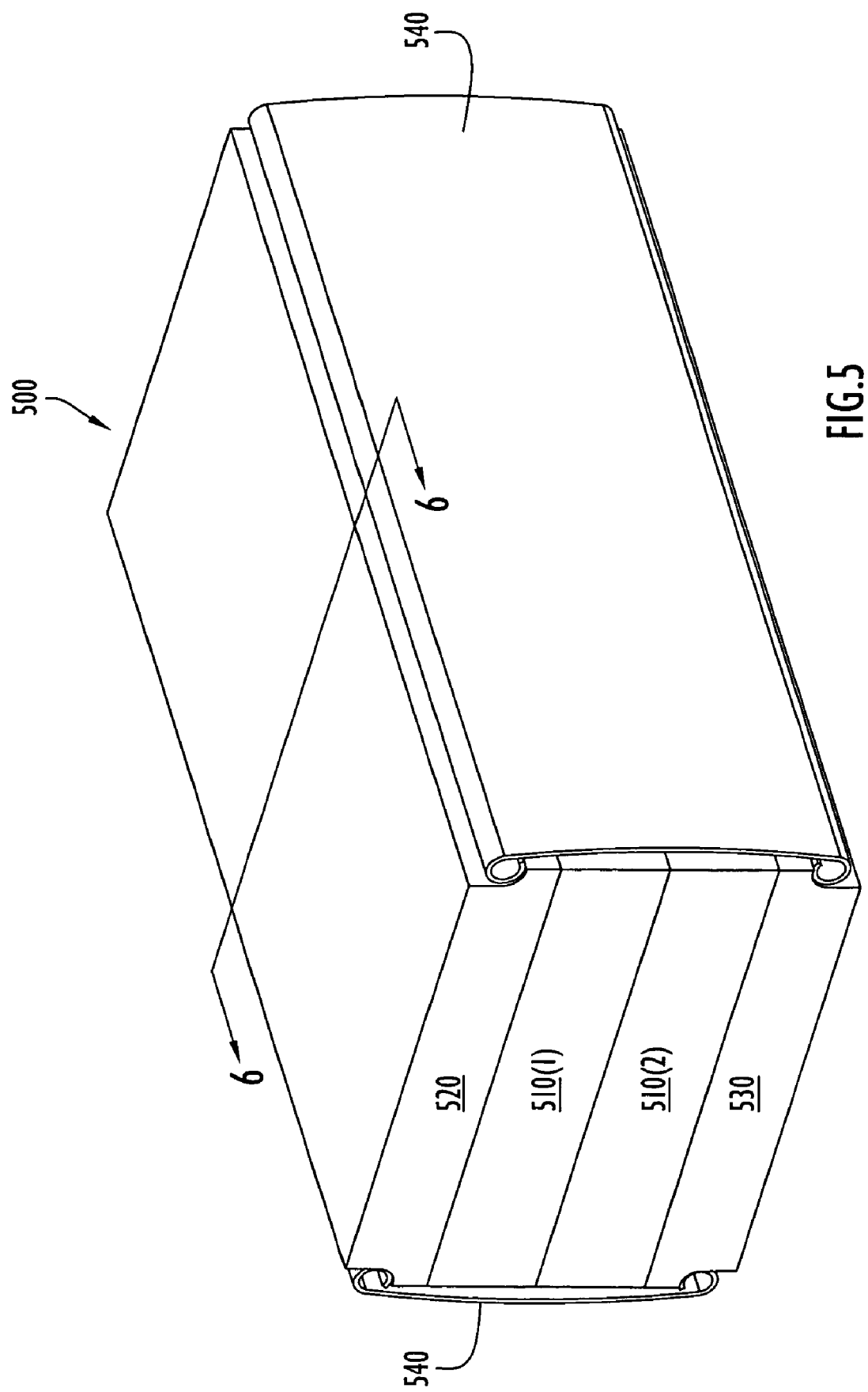
FIG. 5 is a perspective view of the modular enclosure for an embodiment having a plurality of intermediate sections.
Figure 6:
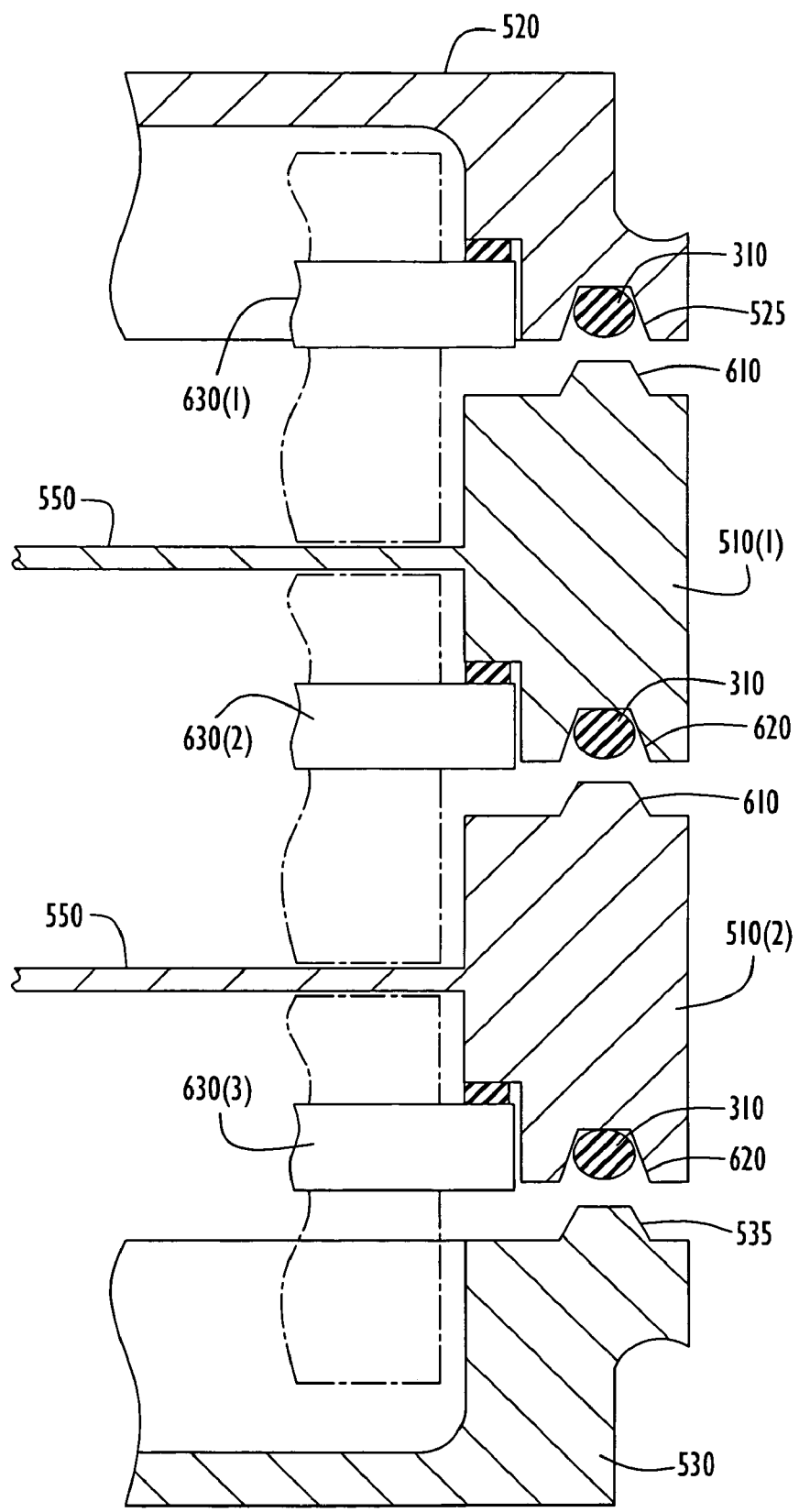
FIG. 6 is a cross-sectional view taken along lines 6-6 of the modular enclosure shown in FIG. 5.

As suggested above, the concepts of the modular enclosure described herein may be extended to a design with multiple intermediate support members. FIGS. 5 and 6 show an example of a modular enclosure 500 that comprises at least two intermediate support members 510(1) and 510(2). Spring clips 540, similar to clips 140, are provided to apply clamping pressure to top and bottom lid members 520 and 530. FIG. 6 also illustrates an alternative embodiment of the complementary tongue and groove mating system structures. In this embodiment, the intermediate members 510(1) and 510(2) have a tongue structure 610 on one surface and a groove structure 620 on an opposite facing surface. In this embodiment, the top lid member 520 has a groove structure 525 to receive the complementary tongue structure 610 on the intermediate member 510(1). Similarly, the groove structure 620 on intermediate lid member 510(1) receives the tongue structure 610 of the intermediate member 510(2). Finally, the tongue structure 535 of the bottom lid member 530 is received by the groove structure 620 of the intermediate member 620. The CCAs 630(1), 630(2) and 630(3) are supported by the intermediate members 510(1) and 510(2) according to the same design aspects as previously described, i.e., interface gasket, environmental gasket, component envelope, etc. The component profile or so called "skyline" of adjacent CCAs in the enclosure may be made to be complementary so as to mesh or fit when mounted inside the enclosure.

With continued reference to FIG. 6, the enclosure described herein provides efficient and customized packaging of the CCAs. The enclosure has additional options for EMI shielding between CCAs, or between components on a single circuit card assembly contained therein. For example, a metal panel 550 may be integrated into the intermediate members to serve as partitions between CCAs. In addition to providing EMI shielding, a metal panel insert can provide thermal sinking capabilities of discrete components through contact with the enclosure elements, e.g., intermediate member, top lid and bottom lid.

Another example of EMI shielding is a flexible conductive cloth placed between CCAs at generally the same position as the panel 550 shown in FIG. 6. One side of the cloth may be formed of a conductive material while the other is a non-conductive material. Flexible cloth allows more compact packing by conforming to the specific shapes of the component envelopes. The panel and cloth are two examples of independent EMI shielding of the CCAs.

Figure 7:
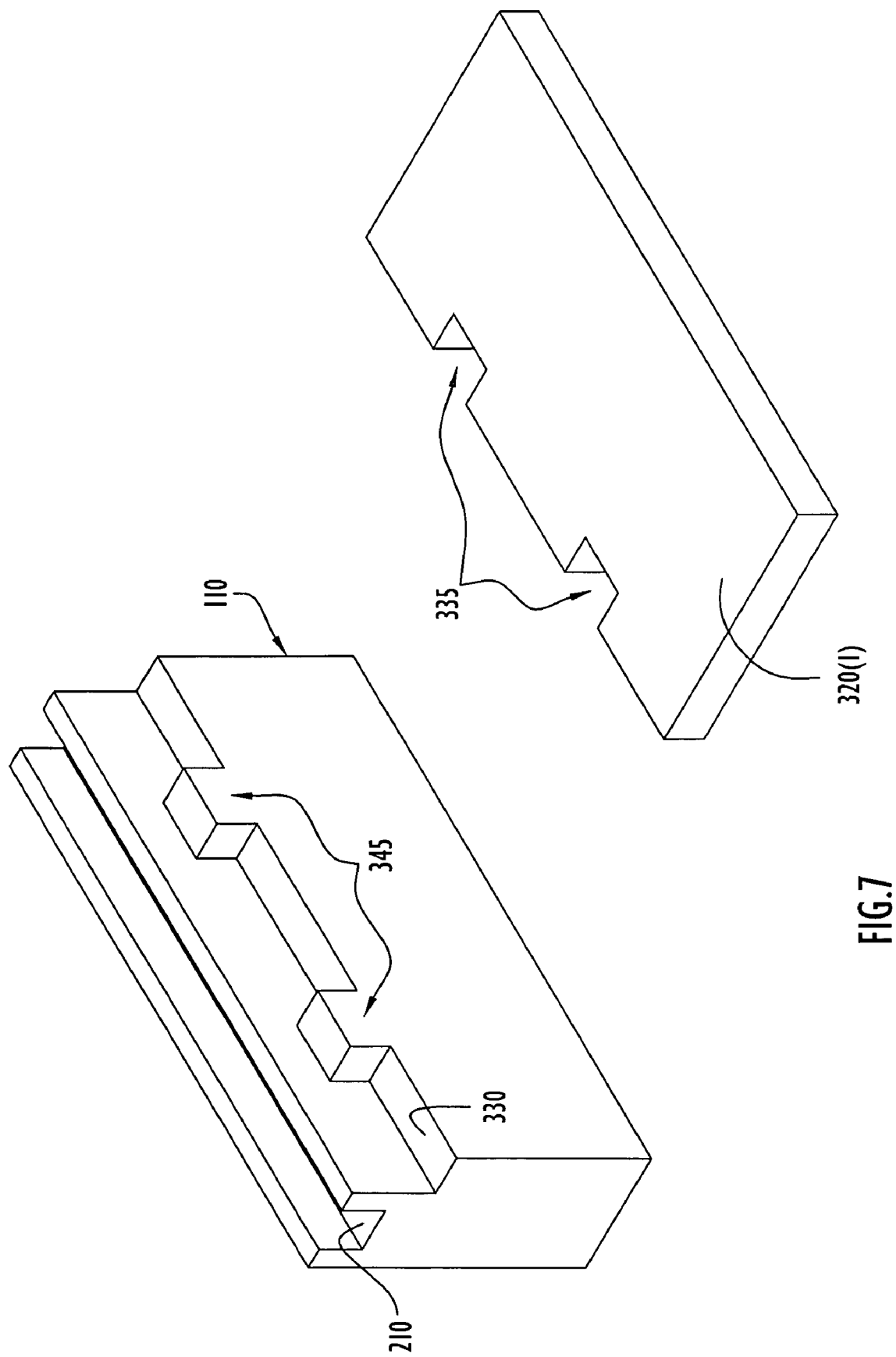
FIG. 7 is a plan view showing a key tab and key notch alignment feature useful to achieve proper positioning of a circuit card assembly and the intermediate in the modular enclosure.

Turning to FIG. 7, a further feature of the enclosure will be described. A CCA 320(1) may have keying notches 335 on a peripheral edge that mate with tabs 345 protruding from a vertical surface of the intermediate member 110. FIG. 7 shows that there are two tabs 345 on the intermediate member 110 that engage corresponding notches on the CCA 320(1); however the same alignment or registration function can be provided by one or more than two complementary tab-notch structures. Moreover, the configuration may be reversed whereby the tabs are provided on the CCA 320(1) and the notches are provided on the intermediate member 110. This feature may be applied to the embodiment shown in FIGS. 5 and 6 as well.

The construction of the modular enclosure provides for ease of both manufacturing and assembly. In manufacturing, the lids are either cast or machined metal (although other materials may also be used, e.g., thermoplastics). The intermediate sections are similarly formed. During assembly, a top down approach can be taken whereby first the bottom lid is placed in an assembly nest. Next, if two CCAs are interconnected with a plug/socket header configuration, they are sub-assembled with the intermediate member sandwiched between the CCAs. Any external I/O components may be installed through the intermediate member at this point. When positioning a CCA with respect to an intermediate member, the tab and notch registration structures described above in connection with FIG. 7 are employed to align/register the CCA with the intermediate member. Access to paired assemblies of CCAs allows nesting of right-angle external I/O connectors and switches in the same intermediate member enclosure section from two adjacent boards. Additional foam pads may be strategically positioned between the CCAs to prevent snubbing from shock and vibration. The CCA/intermediate sub-assembly is then placed on the on the bottom lid and the intermediate section is rested thereon, fitting the complementary tongue and groove structures together. The process is repeated for additional CCAs and intermediate members. The top lid is placed thereon; and, the spring clips are used to clamp the entire enclosure together.

The unlimited mechanical packaging variability allows the use of CCA-mounted right-angle external I/O connectors and switches. Alternatively, if it is not possible or desirable to use such so called "ski boot" connectors, sockets may be provided in the printed wiring board (PWB) into which a component can be plugged into during CCA installation in the enclosure.

Having described preferred embodiments of a modular assembly, it is believed that other modifications, variations and changes may be suggested to those skilled in the art in view of the teachings set forth herein. It is therefore to be understood that all such variations, modifications and changes are believed to fall within the scope of the present invention as defined by the appended claims. For example, the intermediate sections can have I/O components passing there through. Top and bottom lids may be made from a composite material such as a polymer while the intermediate sections are made from a metal based material. Furthermore, while the modular enclosure is described herein as being secured together with clip or clamp members, it may also be desirable for certain applications to secure the top and bottom lid members with one or more intermediate members therebetween using one or more pairs of a screw and nut, as shown in FIG. 1.

In summary, an electronics enclosure is provided comprising: first and second opposing lid members; at least one intermediate member to be secured between the first and second opposing lid members in a sandwich arrangement, each intermediate member having a ledge with a surface to support edges of a circuit card assembly to be contained in the enclosure; and a clip member that engages the first and second lid members and clamps the first and second lid members around the intermediate member.

Further, an electronics enclosure is provided comprising: first and second opposing lids; at least one circuit card assembly support to be secured between the first and second opposing lids in a sandwich arrangement, each support having a ledge with a surface to support a circuit card assembly a hollow space enclosed by the first and second opposing lids; and at least two clips each of which engages a periphery of the first and second lid members on opposite sides therefore and is biased apply clamping pressure to the first and second lid members around the circuit card assembly support.

What is claimed is:

1. An electronics enclosure, comprising:
   a. first and second opposing lid members;
   b. an intermediate member to be secured between the first and second opposing lid members in a sandwich arrangement, said intermediate member having first and second ledges, the first ledge being positioned to oppositely face a surface on the first lid member to hold a first circuit card assembly between the first ledge and the surface of the first lid member, and the second ledge being positioned to oppositely face a surface on the second lid member to hold a second circuit card assembly between the second ledge and the surface of the second lid member; and
   c. a clip member that engages the first and second lid members and clamps the first and second lid members around the intermediate member.

2. The enclosure of claim 1, and further comprising tongue structures on at least one of the first and second lid members and complementary groove structures on the intermediate member that engage the tongue structures on at least one of the first and second lid members.

3. The enclosure of claim 2, and further comprising a gasket member positioned in the groove of the intermediate member, wherein the gasket member is engaged by the tongue on at least one of the first and second lid members to thereby form a barrier from the environment to the internal contents of the enclosure.

4. The enclosure of claim 1, and further comprising groove structures on at least one of the first and second lid members and complementary tongue structures on the intermediate member that engage the groove structures on at least one of the first and second lid members.

5. The enclosure of claim 4, and further comprising a gasket member positioned in the groove of the intermediate member, wherein the gasket member is engaged by the tongue on at least one of the first and second lid members to thereby form a barrier from the environment to the internal contents of the enclosure.

6. The enclosure of claim 1, wherein the first and second lid members comprise a slot along a periphery thereof, and wherein ends of the clip member fit into the slot on the first and second lid members to apply a clamping force that secures the first and second lid members around the intermediate member.

7. The enclosure of claim 6, wherein the clip member is spring biased to apply clamping pressure to the first and second lid members.

8. The enclosure of claim 6, wherein the clip member comprises curved ends, each of which engages the lip of the first and second lid members.

9. The enclosure of claim 6, wherein the clip member is formed of a shaped memory alloy material that shrinks in response to increased or reduced temperature and thereby applies clamping pressure to the first and second lid members.

10. The enclosure of claim 6, wherein the slots on the first and second lid members extends substantially the entire lengths of opposite edges of each of the first and second lid member so that the clip member maintains an evenly distributed clamping pressure on the first and second lid members.

11. The enclosure of claim 1, and further comprising, for each of the first and second ledges, an interface gasket member between the respective first and second ledge of the intermediate member and edges of the first and second circuit card assemblies housed in the enclosure.

12. The enclosure of claim 11, wherein the interface gasket member is formed of material that is thermally and electrical conductive, and exhibits elastic properties.

13. The enclosure of claim 1, wherein at least one of the first and second lid members has a cavity therein that provides space for components on a circuit card assembly inside the enclosure.

14. The enclosure of claim 1, wherein the first and second ledges of the intermediate member face opposite directions.

15. The enclosure of claim 1, and further comprising a plurality of intermediate members, and wherein each intermediate member is capable of supporting a first circuit card assembly on its first ledge between a surface of an adjacent lid member or of another intermediate member and capable of supporting a second circuit card assembly on its second ledge between a surface of an adjacent lid member or of another intermediate member.

16. The enclosure of claim 15, wherein each the plurality of intermediate members are stacked on each other between the first and second lid members.

17. The enclosure of claim 16, wherein the plurality of intermediate members comprise complementary tongue and groove structures to facilitate stacking on each other.

18. The enclosure of claim 17, wherein the first and second lid members comprise tongue or groove structures to mate with a groove or tongue structure, respectively, of an adjacent intermediate member.

19. The enclosure of claim 18, and further comprising a gasket member between the complementary tongue and groove structures of the plurality of intermediate members, and between each of the first and second lid members and an adjacent intermediate member.

20. The enclosure of claim 15, and further comprising a metal panel integrated as part of each of one or more of the plurality of intermediate members to form a partition between adjacent circuit card assemblies and to shield electromagnetic interference between adjacent circuit card assemblies contained in the enclosure.

21. The enclosure of claim 15, and further comprising a flexible cloth between adjacent circuit card assemblies, the flexible cloth having a conductive surface on one face and a nonconductive surface on an opposite face to form a shield of electromagnetic interference from one circuit board assembly to another circuit board assembly contained in the enclosure.

22. The enclosure of claim 1, and further comprising alignment structures on the intermediate member that mate and register with complementary alignment structures on a circuit card assembly to facilitate positioning of the circuit card assembly in the enclosure.

23. The enclosure of claim 1, wherein at least one intermediate member comprises notch structures or tab structures that mate with complementary tab structures or notch structures on a circuit card assembly to facilitate proper alignment of a circuit card assembly in the enclosure.

24. The enclosure of claim 1, and further comprising one or more man-machine interface elements provided on at least one of the first or second lid members, wherein the one or more man-machine interface elements make electrical connection to one or more components on a circuit card assembly contained inside the enclosure and provide user interface functions with respect to devices on a circuit card assembly contained inside the enclosure.

25. The enclosure of claim 1, and further comprising a metal panel integrated as part of an intermediate member to form a shield of electromagnetic interference from one circuit board assembly to another circuit board assembly contained in the enclosure.

* * * * *